(12) United States Patent
Snider et al.

(10) Patent No.: US 7,609,089 B2
(45) Date of Patent: Oct. 27, 2009

(54) FPGA ARCHITECTURE AT CONVENTIONAL AND SUBMICRON SCALES

(75) Inventors: Gregory S. Snider, Mountain View, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/156,877

(22) Filed: Jun. 4, 2008

(65) Prior Publication Data

US 2008/0238478 A1    Oct. 2, 2008

Related U.S. Application Data

(62) Division of application No. 11/343,304, filed on Jan. 31, 2006, now Pat. No. 7,405,462.

(51) Int. Cl.
*H01L 25/00* (2006.01)
*H03K 19/177* (2006.01)

(52) U.S. Cl. .............................. 326/41; 326/38; 326/39

(58) Field of Classification Search ............. 326/38–41, 326/47
See application file for complete search history.

(56) References Cited

U.S. PATENT DOCUMENTS

| | | | |
|---|---|---|---|
| 5,828,229 A | 10/1998 | Cliff | |
| 6,072,716 A | 6/2000 | Jacobson | |
| 6,128,214 A | 10/2000 | Kuekes | |
| 6,150,838 A | 11/2000 | Wittig | |
| 6,215,327 B1 | 4/2001 | Lyke | |
| 6,314,019 B1 | 11/2001 | Kuekes | |
| 6,559,468 B1 | 5/2003 | Kuekes | |
| 6,731,133 B1 | 5/2004 | Feng | |
| 6,760,245 B2 | 7/2004 | Eaton, Jr. | |
| 6,777,982 B2 * | 8/2004 | Goldstein et al. | ........... 326/134 |
| 6,846,682 B2 | 1/2005 | Heath | |

(Continued)

FOREIGN PATENT DOCUMENTS

WO       0173845       10/2001

(Continued)

OTHER PUBLICATIONS

PCT International Search Report, PCT/US2007/002805, filed Jan. 30, 2007, Report issued by European Patent Office Jul. 23, 2007.

(Continued)

*Primary Examiner*—Anh Q Tran (57) ABSTRACT

Reconfigurable logic devices and methods of programming the devices are disclosed. The logic device includes a look-up table (LUT) and at least one storage element configured for sampling LUT output signals. The LUT comprises a plurality of input signals, an array of programmable impedance devices operably coupled to the input signals, and the LUT output signals. Each programmable impedance device in the array includes a first electrode operably coupled to one of the input signal, a second electrode disposed to form a junction wherein the second electrode at least partially overlaps the first electrode, and a programmable material disposed between the first electrode and the second electrode. The programmable material operably couples the first electrode and the second electrode such that each programmable impedance device exhibits a non-volatile programmable impedance. The array may be configured as a one-dimensional or two-dimensional array.

7 Claims, 9 Drawing Sheets

U.S. PATENT DOCUMENTS

| | | | |
|---|---|---|---|
| 6,847,229 B2 * | 1/2005 | New et al. | 326/39 |
| 6,855,647 B2 | 2/2005 | Beck | |
| 6,870,394 B2 | 3/2005 | Kuekes | |
| 2004/0238864 A1 | 12/2004 | Tripsas | |
| 2004/0257736 A1 | 12/2004 | Goldstein | |
| 2005/0017234 A1 | 1/2005 | DeHon | |

FOREIGN PATENT DOCUMENTS

| | | |
|---|---|---|
| WO | 2005053027 | 6/2005 |
| WO | 2005093870 | 10/2005 |

OTHER PUBLICATIONS

Chen, Yong, et al., "Nanoscale molecular-switch crossbar circuits," Nanotechnology 14, pp. 462-468, 2003.

Chen, Yong, et al., "Nanoscale molecular-switch devices fabricated by imprint lithography," Applied Physics Letters, vol. 82, No. 10, pp. 1610-1612, Mar. 10, 2003.

Stewart, D.R., et al., "Molecule-Independent Electrical Switching in Pt/Organic Monolayer/Ti Devices," Nano Letters, vol. 4, No. 1, pp. 133-136, 2004.

* cited by examiner

FPGA ARCHITECTURE AT CONVENTIONAL AND SUBMICRON SCALES

CROSS-REFERENCE TO RELATED APPLICATION

This application is a divisional application of prior application Ser. No. 11/343,304, filed Jan. 31, 2006, now U.S. Pat. No. 7,405,462 the contents of which are incorporated herein by reference.

FIELD OF THE INVENTION

The present invention generally relates to programmable logic devices and more particularly to programmable logic devices using electronic devices exhibiting non-volatile programmable impedance characteristics.

BACKGROUND OF THE INVENTION

Conventional Field Programmable Gate Arrays (FPGAs) require a relatively large amount of area on a semiconductor device. This is due largely to the significant number of configuration bits used to define internal logic functions for each element. In addition, conventional FPGAs, particularly Complementary Metal Oxide Semiconductor (CMOS) devices, are difficult to use in fault-tolerant situations because subatomic particles striking a configuration bit cell may alter the functionality of the circuit.

Furthermore, in some embodiments, the FPGA configuration bits may be of a volatile nature requiring additional external memory for holding the configuration information, additional circuitry for configuring the FPGA, and set-up time to load the configuration after power is applied.

Other embodiments may solve the configuration problem with programmable fuse based configuration bits. However, these embodiments may only be programmed once and are, therefore, not reconfigurable. Still other embodiments may use non-volatile memory such as Flash memory or electrically erasable programmable memory as configuration bits. However, these embodiments may not be fault-tolerant and generally have a larger cell size for the configuration bits. The fault tolerance problem has been addressed to some extent by proposals for upset hardened memory designs. However, these memory cells may be larger, require special process steps, or combinations thereof.

Furthermore, semiconductor device fabrication is becoming increasingly complex and difficult as attempts are made to reduce device size to the nanometer technology range. A new fabrication and device formation plan involving relatively loose tolerances and self-assembly of sub-elements may be required to fully achieve the goal of useable electronic circuits incorporating nanometer-scale devices.

Recent research and development in the fields of nanoelectronics and molecular electronics has included several reports of molecular electronic devices comprised of two electrodes with a molecular compound disposed between the two electrodes. These reported devices have the characteristics of non-volatile configurable switches, wherein a bias may be applied to the molecular electronic device in such a manner as to cause the device to appear substantially like an open switch (i.e. a very high resistance) or substantially like a closed switch (i.e. a very low resistance).

There is a need for a reconfigurable FPGA type logic device that can be adapted for fault tolerance and manufactured at a nanometer scale as well as a conventional micron scale.

BRIEF SUMMARY OF THE INVENTION

The present invention, in a number of embodiments, includes a programmable impedance device having a non-volatile programmable impedance, which may be reconfigured. A reconfigurable logic device including programmable impedance devices may be useful, particularly when the device may be fabricated down to nanometer dimensions. Further, fault tolerance, which is becoming increasingly important both at nanometer-scale and micron-scale applications, may be addressed with a new reconfigurable logic device because the programmable impedance devices may be less vulnerable to subatomic particle upset and may be easily built with redundancy.

In one embodiment of the invention, a reconfigurable logic device includes a look-up table (LUT) and at least one storage element configured for sampling at least one LUT output signal. The look-up table (LUT) comprises a plurality of LUT input signals, an array of programmable impedance devices operably coupled to the plurality of LUT input signals, and the at least one LUT output signal. Each programmable impedance device in the array includes a first electrode operably coupled to one of the plurality of LUT input signal, a second electrode disposed to form a junction wherein the second electrode at least partially overlaps the first electrode, and a programmable material disposed between the first electrode and the second electrode, at least at the junction. The programmable material operably couples the first electrode and the second electrode such that each programmable impedance device exhibits a non-volatile programmable impedance.

In another embodiment of the invention, a reconfigurable logic device includes a look-up table (LUT) and at least one storage element configured for sampling at least one LUT output signal. The look-up table (LUT) comprises a plurality of LUT input signals, an address decoder operably coupled to the plurality of LUT input signals, and an array of programmable impedance devices. The address decoder is configured to generate a plurality of product terms and these product terms are operably coupled to the array of programmable impedance devices. Each programmable impedance device in the array includes a first electrode operably coupled to one of the plurality of LUT input signal, a second electrode disposed to form a junction wherein the second electrode at least partially overlaps the first electrode, and a programmable material disposed between the first electrode and the second electrode at least at the junction. The programmable material operably couples the first electrode and the second electrode such that each programmable impedance device exhibits a non-volatile programmable impedance.

Another embodiment of the invention includes a method of tuning a programmable impedance. The method comprises supplying a reconfigurable logic device including a one-dimensional array of programmable impedance devices. The array is configured as a plurality of substantially parallel first nodes in a first direction and a second node in a second direction, wherein a programmable impedance device is present at a junction where each first node crosses the second node. The method further comprises applying a current sink to the second node. The method also comprises applying a positive voltage pulse to one first node of the plurality of first nodes, the positive voltage pulse having a peak voltage sufficient to decrease an impedance of the programmable impedance device at the junction between the one first node and the second node.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

In the following description, micron-scale dimensions refer roughly to dimensions that range from one micrometer up to a few micrometers, sub-micron scale dimensions refer roughly to dimensions that range from 1 micrometer down to 0.05 micrometers, and nanometer scale dimensions refer roughly to dimensions that range from 1 nanometer up to 50 nanometers (0.05 micrometers).

The term "storage element" means a device that may store, for a predetermined amount of time, at least two states: asserted and negated (i.e., 0 or 1). Flip-flops, latches, RAMs, and ROMs are examples of storage elements. In most cases, but not all, storage elements are configured to change state based on the state of a clock signal. A set-reset latch is an example of a storage element that may not use a clock signal for state changes.

The term "volatile" means the capability of a storage element to store a state for a predetermined period of time, but loses the state when power is removed from the storage element. On the other hand, the term "non-volatile" means the capability of a storage element to maintain its stored (i.e., programmed) state even when power is removed from the storage element.

The term "singly configurable" means that a device can change its state only once via an irreversible process. A programmable read only memory, fuse, or anti-fuse are examples of singly configurable devices.

The term "reconfigurable" means that a device can change its state multiple times via a reversible process. In other words, when acting as a switch (or a storage element), a reconfigurable device can be opened and closed (negated or asserted) multiple times. A random access memory is an example of a reconfigurable device.

The term "programmable logic device" means a device that contains elements that may be programmed (either singly configurable or reconfigurable) to perform a combinatorial logic function, the result of which may be input to a storage element.

As previously discussed, a conventional programmable logic device (PLD) may use ROM, fuses, or antifuses to create the programmable portion of a singly configurable PLD. Similarly, flash memory, and EEPROM may be used to create a non-volatile reconfigurable PLD and RAM may be used to create a volatile reconfigurable PLD. Embodiments of the present invention use programmable impedance devices, in a number of representative configurations, to create a new form of non-volatile, reconfigurable PLD.

Figure 1:
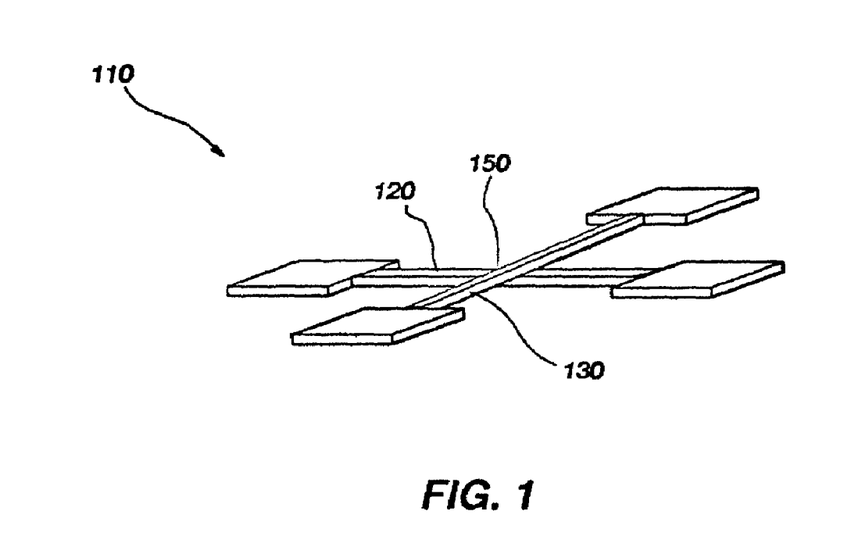
FIG. 1 is a three dimensional view of a programmable impedance device according to an embodiment of the present invention.
Figure 2:
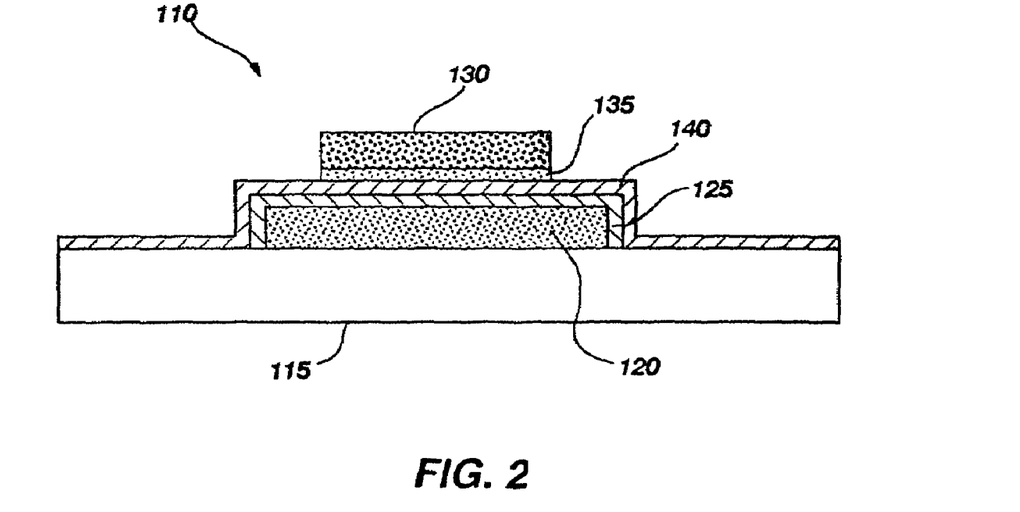
FIG. 2 is a cross-sectional view of the programmable impedance device according to an embodiment of the present invention.

A programmable impedance device 110 according to a particular embodiment of the present invention, using crossed rectangular electrodes, is shown in FIGS. 1 and 2. The programmable impedance device 110 includes a first electrode 120 disposed on a substrate 115 in a first direction, a programmable material 140 disposed over at least a portion of the first electrode 120 and a second electrode 130 disposed over the programmable material 140 at a non-zero angle relative to the first electrode 120.

The programmable impedance device 110 may be formed on a variety of suitable insulating or semiconducting substrates 115, such as, for example: a suitable plastic; silicon; silicon on insulator (SOI), glass, silicon oxide, sapphire; gallium arsenide; indium phosphide; or other semiconductor with or without an additional oxide or nitride coating. As used herein, the term substrate 115 includes and encompasses all such substrates 115.

Additionally, the programmable impedance devices 110 may be processed as additional layers on a semiconductor wafer where processing includes a conventional metal oxide semiconductor (MOS) process or a conventional bipolar process. In addition, the programmable impedance devices 110 may be fabricated on silicon dioxide. As a result, conventional MOS devices may be processed on a semiconductor wafer followed by a dielectric layer, such as silicon dioxide, silicon nitride, or silicon carbide. Vias may be formed through the dielectric to couple conventional MOS devices to programmable impedance devices 110. Then, the programmable impedance devices 110 may be formed on the dielectric to couple to the conventional MOS devices. Similar methods may be used to couple the programmable impedance devices 110 to photonic devices, which are typically formed on group III-V materials, such as, for example, gallium arsenide, and indium phosphide.

In one embodiment of the invention, the first electrode 120 comprises platinum and the second electrode 130 comprises titanium. These metals, in combination with a wide variety of programmable materials 140, create an asymmetric electrode sandwich, which may exhibit switching and well-controlled non-volatile programmable impedance properties.

Figure 3:
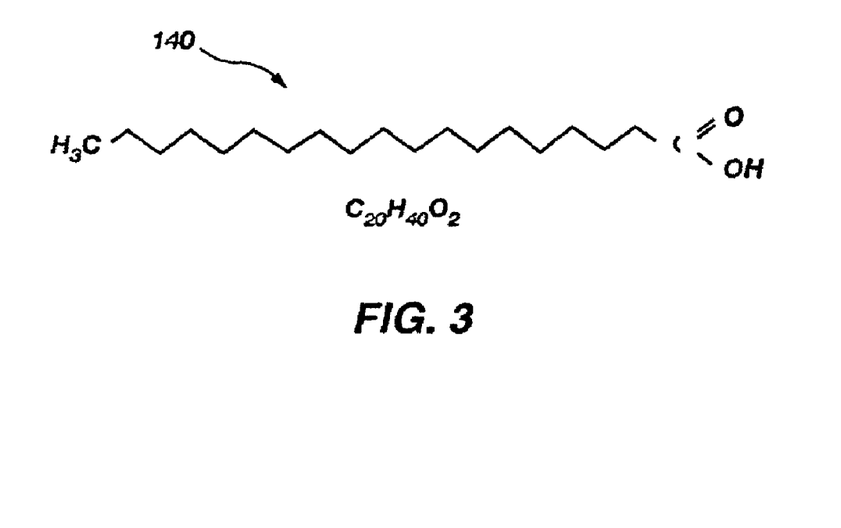
FIG. 3 is a chemical diagram of a programmable material suitable for use in the present invention.

A wide variety of programmable materials 140 may be useful in practicing the present invention. FIG. 3 illustrates eicosanoic acid ($C_{19}H_{39}COOH$) as a representative material that may be used as the programmable material 140. Eicosanoic acid is used for most discussion purposes for clarity and because it forms well characterized, highly ordered, Langmuir-Blodgett films and has been shown to have insulative properties. Some other representative programmable materials 140 include: stearic acid ($C_{17}H_{35}COOH$), poly (methyl methacrylate) (abbreviated as PMMA), tantalum oxide $Ta_2O_5$, and chlorophyll-B. In addition, a class of rotaxane or pseudo-rotaxane molecules may be useful as programmable materials 140. Furthermore, in some embodiments, the programmable material 140 may comprise one or more elements that are either layered, intermixed homogenously, or intermixed nonhomogenously. For example, the programmable material 140 may include a first interface element 125 and a second interface element 135. These interface elements 125 and 135 are explained more fully below.

In fabricating the programmable impedance device 110, a layer comprising first electrodes 120 may be formed on a suitable substrate 115, using conventional deposition and patterning technology (such as, for example, sputter deposition, evaporation), vapor deposition techniques, and lithographic techniques including optical, ultraviolet, and electron beam techniques. Electrodes formed with conventional semiconductor techniques generally may have a somewhat rectangular cross section, although trapezoidal, circular, and rounded cross sections and combinations of the foregoing may be used. In addition, the first electrodes 120 may be formed by known techniques, such as, for example, chemically prepared metal nanowires and chemically prepared semiconductor nanowires. In a tested embodiment, the first electrodes 120 were formed with a platinum layer of about 100 nm thickness using conventional optical lithographic techniques. Some other representative materials that may be used for the first electrodes 120 include aluminum, silicon, and tungsten.

In some embodiments, it may be desirable to tailor the surface of the first electrodes 120 following deposition. For example, it may be desirable to perform planarization or smoothing processes. In addition, it may be desirable to form a nano-textured topography or chemical species functionalization. These processes may create a smoother surface on the first electrodes 120 and reduce the possible distinct height transitions between the substrate 115 and the first electrodes 120. Furthermore, this tailoring process may enhance deposition results for the programmable material 140 or first interface element 125. Representative tailoring processes that may be used are described in U.S. patent application Ser. No. 10/405,294, entitled "Custom Electrodes for Molecular Memory and Logic Devices," the contents of which are incorporated herein by reference. (now U.S. Pat. No. 6,855,647, issued Feb. 15, 2005).

If desired, a first interface element 125 may be formed between the first electrodes 120 and the programmable material 140. This interface element 125 may enhance the operable coupling between the first electrodes 120 and the programmable material 140 and may enhance the programmable characteristics of the programmable impedance device 110. Some of this enhancement may result from the interface element 125 forming a tunnel barrier between the first electrodes 120 and the programmable material 140. For example, and not by way of limitation, an oxide layer may be developed on the first electrodes 120. One such interface element 125 includes a thin layer of platinum oxide over platinum first electrodes 120. Other suitable interface elements include titanium oxide and titanium carbide.

Programmable material 140 may be deposited over all or part of the substrate 115, first electrodes 120, and, if present, first interface element 125, using material deposition methods that create a high degree of molecular anisotropy in a monolayer of the programmable material 140. Some example deposition methods include vapor deposition, self-assembled monolayers (SAM), and Langmuir-Blodgett (LB) film deposition techniques. LB film deposition conventionally involves the process of creating a monolayer of a molecular compound on the surface of water or other suitable liquid. The monolayer may then be transferred to the surface of a substrate 115 by pulling the substrate 115 through the monolayer-covered liquid. Additional monolayers may be added by repeatedly immersing and removing the substrate 115 through the monolayer-covered liquid. This technique produces a uniform coating of the programmable material 140 on the substrate 115 and over the first electrodes 120. Some embodiments of the invention may use a single monolayer. Other embodiments of the invention may use a plurality of monolayers.

Similar to the interface between the first electrodes 120 and the programmable material 140, a second interface element 135 may be formed between the programmable material 140 and the second electrodes 130. As explained above for the first interface element 125, the second interface element 135 may enhance the operable coupling between the programmable material 140 the second electrodes 130 and may enhance the programmable characteristics of the programmable impedance device 110. Representative second interface element 135 materials are the same as those outlined above for the first interface element 125.

A layer of second electrodes 130 may be deposited over the programmable material 140 or second interface element 135 to complete formation of the programmable impedance device 110. The second electrodes 130, as well as the first electrodes 120, may include a conductive material that has at least a small amount of reactivity with the adjoining programmable material 140. Some representative conductive materials that may be used include titanium, aluminum, chromium, and platinum. Many different deposition techniques may be used to place the layer of second electrodes 130 on the programmable material 140, such as, conventional photolithography deposition/etching techniques, imprinting, and nanotechnology deposition techniques (such as nanowires formation) described for the formation of the first electrodes 120. The deposition technique for the second electrodes 130 should be a technique that does not unduly damage the deposited film of programmable material 140.

In one representative embodiment, the second electrodes 130 of titanium was evaporated onto the organic film through a shadow mask to a thickness of about 5 nm. An aluminum layer (thickness of approximately 200 nm) was then deposited on the titanium layer through the shadow mask without breaking vacuum.

Programmable material 140 not sandwiched between the two electrode layers at junctions 150 of the electrodes may be considered excess programmable material. In some embodiments, excess programmable material may be removed after deposition of the second electrodes 130. In other embodiments, the excess programmable material may be left in place.

A programmable impedance device 110, as illustrated in FIG. 1, may be formed anywhere that a first electrode 120 and second electrode 130, cross with a layer of programmable material 140 between the pair of electrodes (120 and 130). As a result, the electrode crossings do not need to be perpendicular. In fact, they may be oriented at any non-zero angle. Furthermore, while FIG. 1, illustrates the electrodes (120 and 130) configured as crossed electrodes, many other configurations are contemplated as being within the scope of the invention. By way of example, and not limitation, the first and second electrodes (120 and 130) may be disposed such that the electrodes overlap partially, overlap completely, or approach each other such that there is no full crossing. In addition, the electrodes (120 and 130) may not be long thin lines as illustrated in FIG. 1. For example, they may be shaped as a small circle or an external probe. The electrodes (120 and 130) may also be configured in a variety of cross sectional profiles, such as, for example, the rectangular profile shown in FIGS. 1 and 2, a trapezoidal profile, a partially circular profile, or a partially ellipsoid profile. Additionally, placement of the layer of second electrodes 130 relative to the underlying layer of first electrodes 120 may include relatively loose tolerances.

The size of the overlapping programmable impedance device 110 formed at the overlap, or junction 150, of the first electrode 120 and the second electrode 130 may vary widely. Representative programmable impedance devices 110 were formed and operated with lateral junction dimensions of about 10 micrometers and with lateral junction dimensions of about 40 nanometers. The non-volatile bistable impedance and non-volatile programmable impedance properties of the present invention should continue to scale down to the nanometer-scale in lateral junction size, enabling many nano-electronic applications. Device size may be largely a function of component density requirements and compatibility with other devices that may be fabricated on the substrate 115. For example, larger devices may be desirable for use with conventional semiconductor devices and fabrication techniques. Similarly, smaller devices may be desirable when formed with other nanometer scale structures or processes. Additionally, other combinations of conventional semiconductor devices and nanoscale devices with the present invention are possible.

It will be readily apparent to a person of ordinary skill in the art that the configuration of first electrodes 120 and second electrodes 130 can be somewhat arbitrary. The processing steps may be reversed such that the material comprising the second electrodes 130 is formed first and nearest to the substrate 115, while the material comprising the first electrodes 120 is formed last and farthest from the substrate 115.

Figure 4:
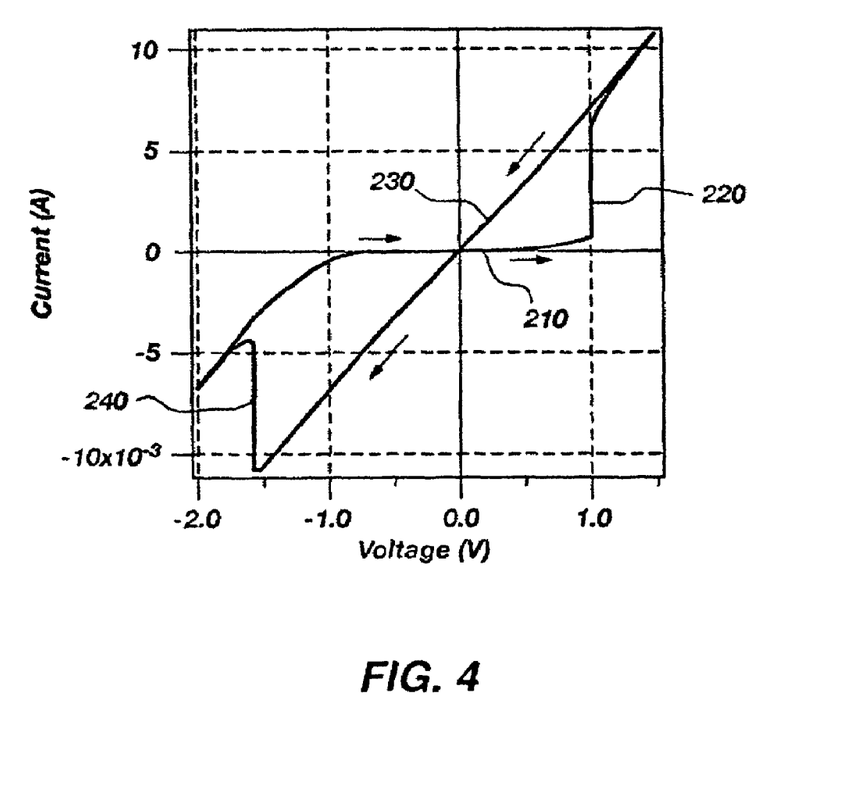
FIG. 4 is a graphic illustration of a hysteretic current voltage characteristic of one embodiment of the present invention.

The programmable impedance devices 110 according to the present invention may be configured to exhibit the properties of a non-volatile bistable impedance. FIG. 4 illustrates a representative non-volatile bi-stable impedance property in a current vs. voltage (I-V) curve, which shows a hysteresis loop traversed as a "bow tie," as indicated by the arrows. As a first voltage bias (positive in this example) is applied to the programmable impedance device 110, the I-V curve follows a high impedance state 210 to about one volt, where the I-V curve shows an impedance decrease 220 to a low impedance state 230. As the voltage bias is decreased, the I-V curve is indicative of the low impedance state 230. When an opposite voltage bias (negative in this example) is then applied, the I-V curve follows the low impedance state 230 until about 1.5– volts where an impedance increase 240 occurs. As the bias is returned to zero, the I-V curve is indicative of the high impedance state 210.

FIG. 4 illustrates the behavior of a possible embodiment of a programmable impedance device 110. The first voltage at which the distinct impedance decrease 220 occurs, as well as the second opposite voltage at which the distinct impedance increase 240 occurs, are somewhat dependent upon and vary based upon the programmable material 140, electrode materials 120 and 130, and interface elements 125 and 135 used in the programmable impedance device 110.

Similarly, impedance values for the low impedance state 230 and high impedance state 210 may vary with different programmable materials 140, electrode materials 120 and 130, and interface elements 125 and 135. For representative programmable materials 140 and device configurations tested, the resistive component of the low impedance state 230 was measured as low as the kilo-ohm region, while the resistive component of the high impedance state 210 was measured as high as the hundred of Mega-ohm region.

After this program procedure using relatively high voltages, when small bias voltages below the absolute values of the positive and negative transition thresholds are applied to the programmable impedance devices 110, both the high impedance state 210 and the low impedance state 230 will remain stable and substantially constant.

The non-volatile programmable impedance behavior is stable, yet reconfigurable. At some later time, when a different impedance value is desired, such as after operational use in one configuration, the programming process may be repeated to set the programmable impedance device 110 to a different impedance value in another configuration.

A non-volatile programmable impedance device 110 may be used in cooperation with other electronic circuits to form a non-volatile reconfigurable PLD. Additionally, the reconfigurable nature of the present invention can be an enabling element for defect-tolerant reconfigurable PLDs, which may be useful for nanometer-scale electronics including molecular electronics.

Figure 5:
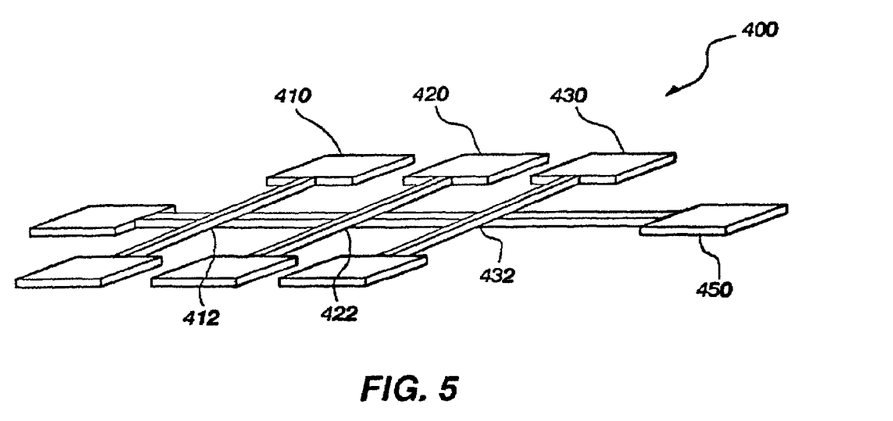
FIG. 5 is a three-dimensional view of a plurality of programmable impedance devices arranged to implement a representative application of the present invention.

FIG. 5 illustrates a three-dimensional view of a plurality of programmable impedance devices 110 arranged as a one-dimensional array to implement a 1×3 crossbar using the programmable impedance devices 110 of the present invention. Three input nodes formed as second electrodes 130 cross an output node 450 formed as a first electrode 120 to form a programmable logic array comprised of three programmable impedance devices 110, (also referred to as bistable resistors). A first node 410 crosses the output node 450 to form a first bistable resistor 412 at the junction 150 between the first node 410 and the output node 450. A second node 420 crosses the output node 450 to form a second bistable resistor 422 at the junction between the second node 420 and the output node 450. A third node 430 crosses the output node 450 to form a third bistable resistor 432 at the junction between the third node 430 and the output node 450.

The programmable logic array may also be configured with the output node 450 as the second electrode 130 crossing the input nodes formed as first electrodes 120. It will be clear to a person of ordinary skill in the art that other complex configurations are possible. Also, additional circuitry, for example, diodes, may be combined with the programmable logic gate.

Figure 6:
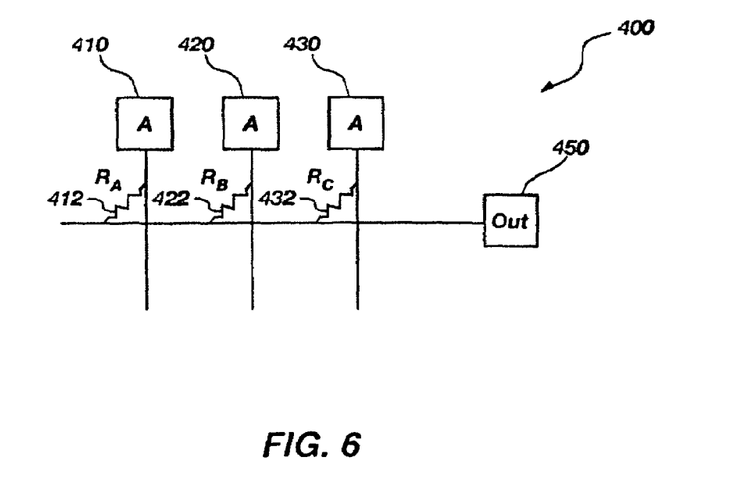
FIG. 6 is a schematic representation of the representative application of FIG. 5.

FIG. 6 shows a schematic version of the resulting circuit. In operation, the programmable logic array is a network of bistable resistors wherein each resistor may be independently tuned to a relatively low impedance state or a relatively high impedance state using the tuning process described above.

For example, the first tunable resistor 412 may be tuned to a low impedance state, the second tunable resistor 422 may be tuned to a high impedance state, and the third tunable resistor 432 may be tuned to a low impedance state.

Figure 7:
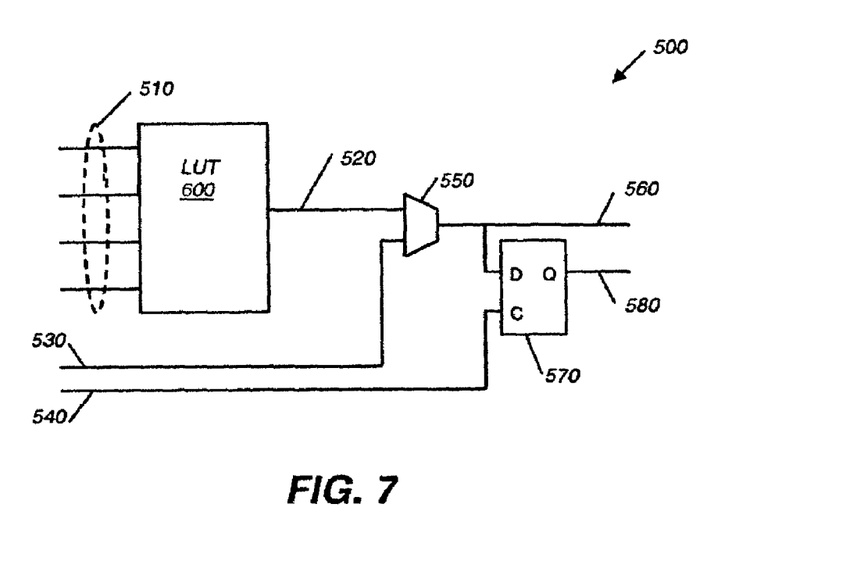
FIG. 7 is an embodiment of a reconfigurable logic device.

FIG. 7 illustrates one embodiment of the present invention as a reconfigurable logic device 500, which may be used within an FPGA. Those of ordinary skill in the art will recognize that FIG. 7 is merely one representative implementation of a reconfigurable logic device 500. A number of other implementations for a reconfigurable logic device 500 are also possible. By way of example, and not limitation, the reconfigurable logic devices 500 may be combined to create a RAM configuration, or may be optimized, perhaps with additional conventional logic elements, for arithmetic functions such as adders and multipliers. In addition, a large number of reconfigurable logic devices 500 may be integrated into a single device to form a robustly flexible FPGA.

In the embodiment of FIG. 7, the reconfigurable logic device 500 includes a look-up table 600 (LUT), a plurality of LUT input signals 510, a LUT output signal 520, a multiplexer 550, an optional input signal 530, a clock signal 540, a storage element 570, a registered output 580, and an optional unregistered output 560.

The multiplexer 550 may be used to drive the unregistered output 560 from the optional input signal 530 or the LUT output signal 520 based on the state of a multiplexer select signal (not shown). The unregistered output 580 may be used as an input to the storage element 570 to generate the registered output 580 at a specific state, or edge, of the clock signal 540. For example, if the storage element 570 is a flip-flop, the registered output 580 may sample the unregistered output 580 at a rising edge or a falling edge of the clock signal 540. As another example, if the storage element 570 is a latch, the registered output 580 may sample the unregistered output 580 at a high level or a low level of the clock signal 540.

The LUT-600 may be configured to generate a reconfigurable set of logic equations to generate the registered output 580 and the unregistered output 580 for any possible logic combination of the LUT input signals 510.

Figure 8:
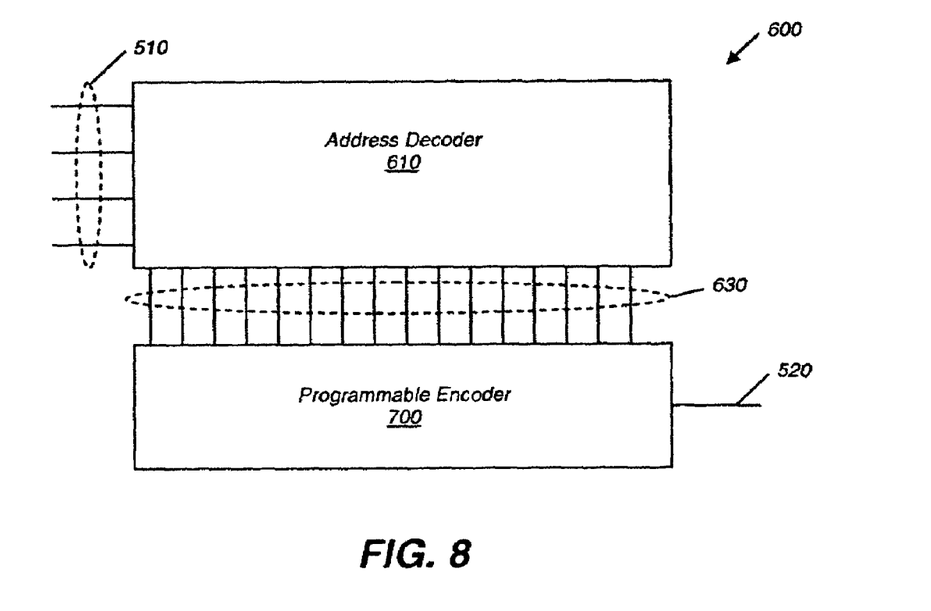
FIG. 8 is an embodiment of a look-up table including an address decoder and a programmable encoder.

FIG. 8 illustrates one embodiment of a LUT 600 with four LUT input signals 510, an address decoder 610, a programmable encoder 700, and one LUT output signal 520. Those of ordinary skill in the art will recognize that other configurations with a different number of LUT input signals 510 and LUT output signals 520 may be implemented within the scope of the present invention.

Logic equations generally may be referred to as a sum of products. Product refers to the logical "AND" of a number of terms, and sum refers to the logical "OR" of those products. In the LUT 600 embodiment of FIG. 8, the address decoder 610 may decode the four input signals into 16 product terms 630. The programmable encoder 700 may use the product terms 630 to generate the LUT output signal 520 (e.g., as a sum of the product terms 630). The address decoder 610 of FIG. 8, may use a conventional decoding, used in most memory device, which decodes N address terms-to generate all $2^N$ possible product terms. As additional examples, three inputs may be used to generate eight product terms, or five inputs may be used to generate 32 product terms. In this decode technique, for any given combination of asserted and negated input terms, one of the possible product terms 630 will be asserted and the other product terms 630 will be negated.

Figure 9:
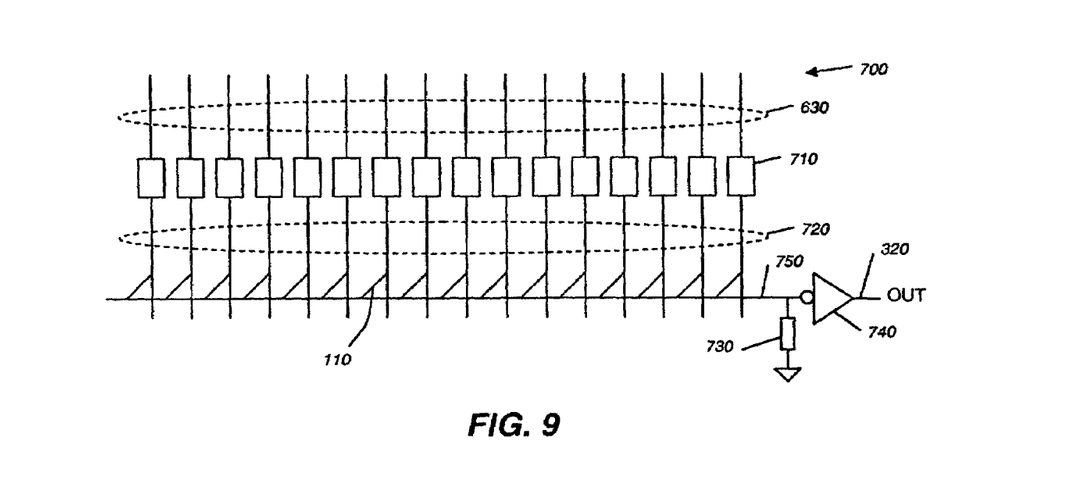
FIG. 9 is an embodiment of a programmable encoder.

FIG. 9 illustrates an embodiment of the programmable encoder 700, which includes the product terms 630, a plurality of programmable impedance devices 110, a plurality of sum programming elements 710, buffered product terms 720, a sum term 750, a pull-down element 730, and an inverting output buffer 740. The pull-down element 730 is coupled between the sum term 750 and a ground. This pull-down element 730 may be any element capable of exhibiting a substantially stable impedance value, such as, for example, a polysilicon resistor, a diffusion resistor, or a CMOS transistor.

Each junction between a buffered product term 720 and the sum term 750 forms a programmable impedance device 110 similar to that shown in FIGS. 1, 2, and 5. As previously discussed, for any given address, one of the product terms 630 is asserted and the other product terms 630 are negated. If an asserted product term 630 is defined as a high voltage, the programmable impedance device 110 coupled to that product term 630 and the pull-down element 652 form a resistor divider network.

Figure 10:
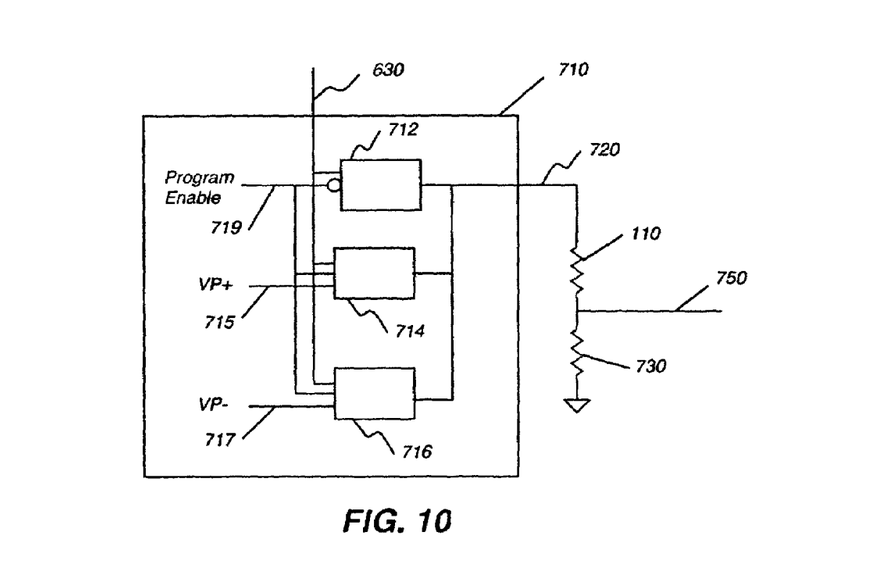
FIG. 10 is an embodiment of a programming module, which may be used for programming the programmable impedance devices of the programmable encoder.

FIG. 10 includes a schematic representation of this resistor divider network and the sum programming element 710. In order to examine the resistor divider network, by way of example and not limitation, assume the programmable impedance devices 110 may have a high impedance state of about 100 kilo-ohms and a low impedance state of about 1 kilo-ohms. Also, assume the pull-down element 730 has an impedance value of about 10 kilo-ohms. A high (i.e. an asserted value) on the buffered product term 720 will generate a different voltage depending on whether the programmable impedance device 110 is programmed in the high impedance state (i.e. programmed as a logic 1) or the low impedance state (i.e. programmed as a logic 0). In the high impedance state (logic 1), the sum term 750 will have a voltage of about $(10*Vx)/(100+10)=0.091*Vx$, where Vx is the voltage on the buffered product term 720. In the low impedance state 230 (logic 0), the sum term 750 will have a voltage of about $(10*Vx)/(1+10)=0.919*Vx$. Thus, for these values of impedance, the inverting output buffer 660 should recognize a low as $0.091*Vx$ or less, and a high as $0.919*Vx$ or more.

Those of ordinary skill in the art will recognize that programming high impedance as a logic 1 and low impedance as a logic 0 is arbitrary. Within the scope of the present invention, the logic may easily be configured to program the logic levels opposite to those described.

Within the sum programming element 710 illustrated in FIG. 10, the product term 630 may be coupled to three enable buffers (712, 714, and 716). These three enable buffers (712, 714, and 716) may be set to a high impedance state if the product term 630 is negated. However, if the product term 630 is asserted, the data enable buffer 712 may drive a high onto the buffered product term 720. Similarly, if the product term 630 is asserted, the high program enable buffer 714 and the low program enable buffer 716 may be used to program the programmable impedance device 110 coupled to that particular sum programming element 710. The VP+ input 715 may include a positive voltage pulse suitable for decreasing the impedance of a programmable impedance device 110, as previously described. Similarly, the VP− input 717 may include a negative voltage pulse suitable for increasing the impedance of a programmable impedance device 110.

The sum programming element 710 may also include a program enable signal 719 to keep the data enable buffer 712 in a high impedance state 210 during programming, and keep the high program enable buffer 714 and low program enable buffer 716 in a high impedance state 210 during normal operation.

The sum programming element 710 of FIG. 10 is one example of an apparatus suitable for carrying out the method of programming the programmable impedance devices 110. Those of ordinary skill in the art will recognize that there may be a large number of implementations within the scope of the present invention that are capable of carrying out the method of programming the programmable impedance devices 110.

Figure 11:
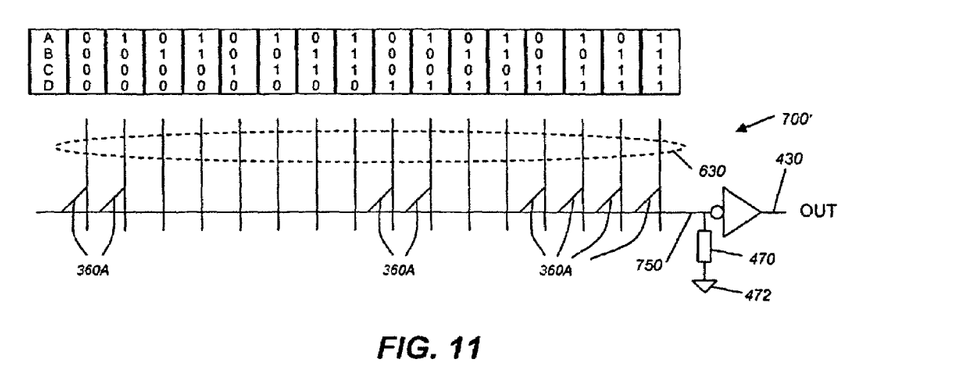
FIG. 11 is an embodiment of a programmable encoder programmed to implement a specific logic equation.

FIG. 11 illustrates an embodiment of a programmable encoder 700' programmed to implement a specific logic equation. The sum programming elements 710 have been omitted from FIG. 11 for ease of discussion only. The table above the product terms 630 illustrate the logic states required on the LUT input signals 510 to assert each particular product term 630.

In FIG. 11 the programmable impedance devices 360A of some of the product terms 630 are programmed to a logic 1, which is illustrated by the diagonal line between the sum term 750 and a product term 630. It is understood the programmable impedance devices 110 for the other product terms 630 are programmed to a logic 0. This programming generates the sum of products logic equation (!B and !C) or (C and D).

Figure 12:
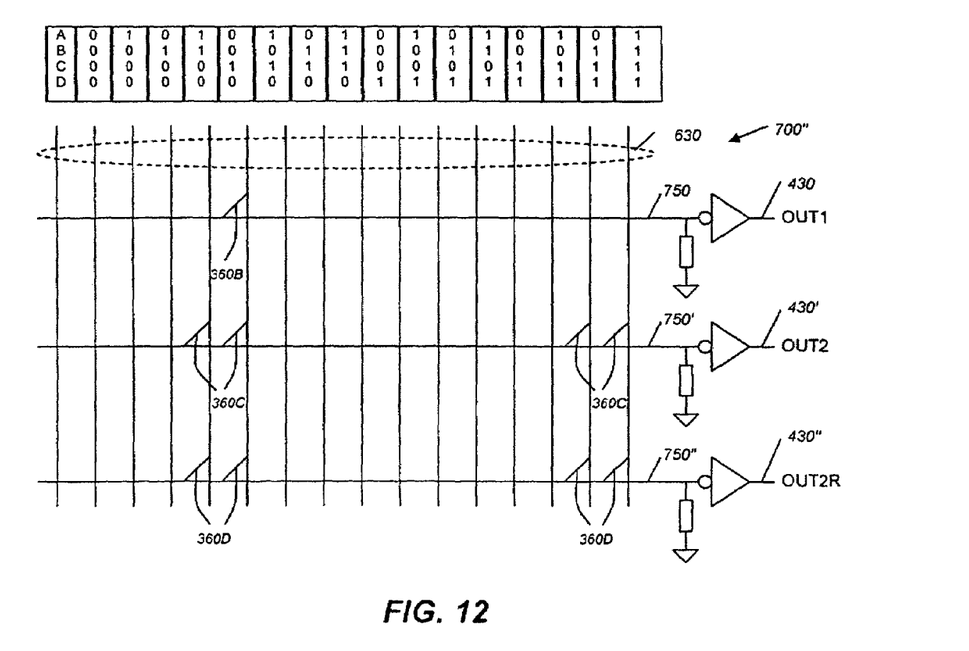
FIG. 12 is another embodiment of a programmable encoder including a plurality of output signals.

FIG. 12 illustrates a representative embodiment of a programmable encoder 700'' configured with redundancy and multiple sum of product terms (750, 750', 750''). As with FIG. 11, the sum programming elements 710 have been omitted from FIG. 12 for ease of description only. The table above the product terms 630 illustrate the logic states required on the LUT input signals 510 to assert each particular product term 630. A first sum term 750 is programmed with programmable impedance devices 360B programmed to a logic 1 to generate the sum of products logic equation (A and !B and C and !D).

A second sum term 750' and a third sum term 750'' are both programmed the same to form redundant sum terms. The programmable impedance devices 360C and 360D are programmed to a logic 1 to generate the sum of products logic equation (!B and C and !D) or (B and C and D). By generating redundant sum terms, other logic (not shown) may select one of the redundant terms if faulty programming is present on the other term.

Figure 13:
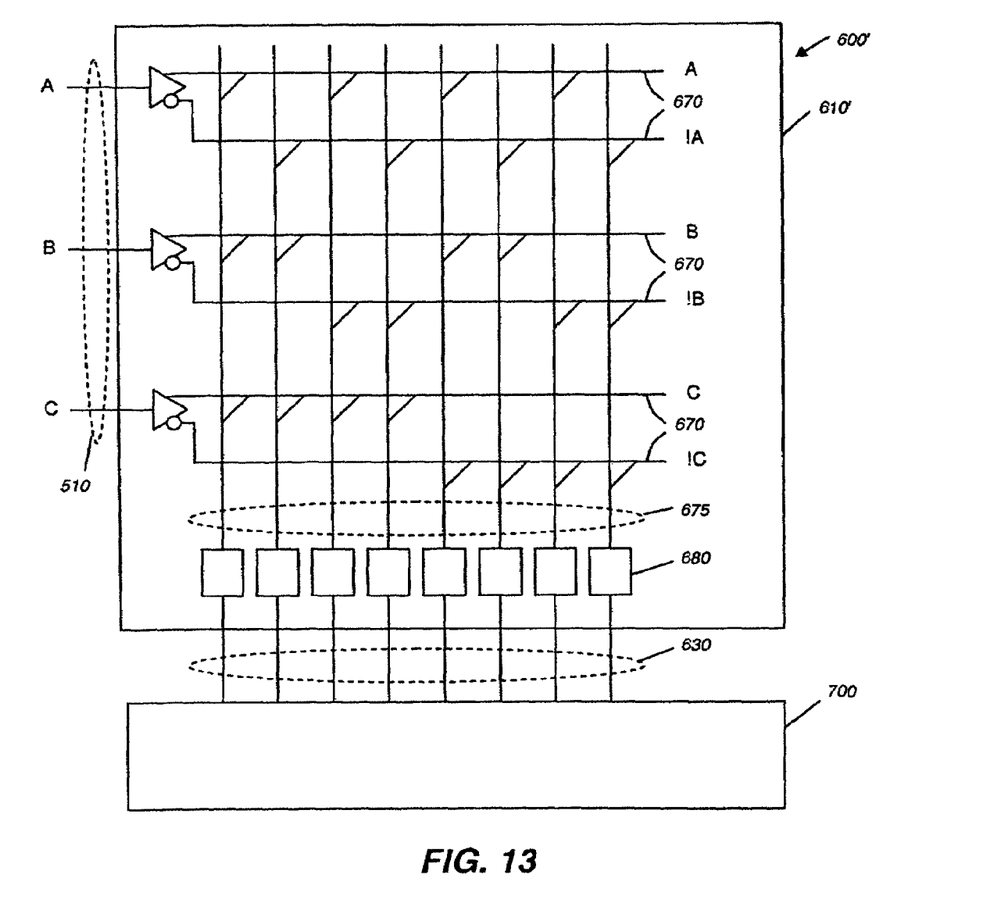
FIG. 13 is an embodiment of a look-up table including programmable impedance devices in the address decoder and the programmable encoder.
Figure 14A:
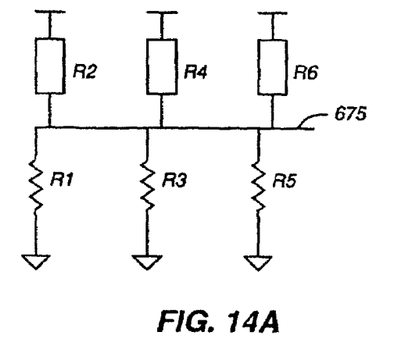
FIGS. 14A-14D illustrate possible combinations of resistor networks for the address decoder of FIG. 13.
Figure 14B:
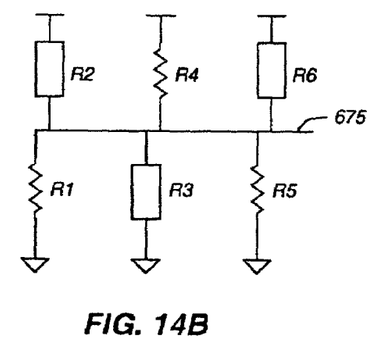
Figure 14C:
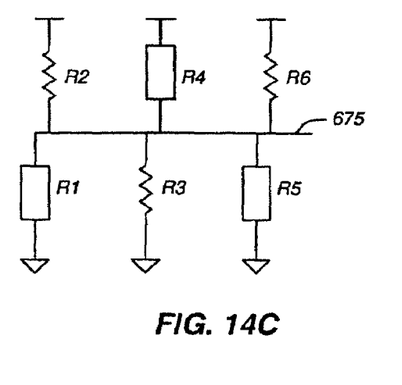
Figure 14D:
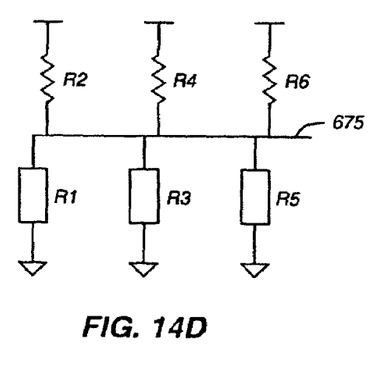

FIG. 13 is a representative embodiment of a look-up table 600' using programmable impedance devices 110 in both the address decoder 610' and the programmable encoder 700. The address decoder 610' includes three LUT input signals 510. Address buffers convert the LUT input signals 510 into asserted and negated address terms. At the point where each address term 670 crosses each of the intermediate product terms 675, a programmable impedance device is formed. Each intermediate product term 675 is operably coupled to a voltage detector 680. The voltage detectors 680 output the product terms 630 for the programmable encoder 700.

FIG. 13 illustrates the address decoder 610' configured in a typical binary decoding, where the angled line connecting an address term 670 and an intermediate product term 675 indicates a "programmed device 700." The programmed state may be defined as a low impedance state or a high impedance state for different embodiments. In FIG. 11, assume that the programmed device 700 is a high impedance state. All programmable impedance devices 110 at intersections of address terms 670 and intermediate product terms 675 not showing an angled line are programmed in a low impedance state. For any given address, each intermediate product term 675 connects to three resistors (i.e., programmable impedance devices) connected to a high voltage (an asserted address term 670) and three resistors connected to a low voltage (a negated address term 670). In addition, after programming, each product term 630 connects to three programmed devices 700 and three un-programmed devices. This configuration creates a resistor network on each intermediate product term 675.

FIGS. 14A-14D illustrate the possible resistor networks for an intermediate product term 675 as resistors R1-R6. The three resistors, shown schematically as a box, illustrate unprogrammed (i.e., low impedance) programmable impedance devices. The three resistors, shown schematically as a resistor, illustrate programmed (e.g., high impedance) programmable impedance devices. For example, in FIG. 14A, three resistors are programmed to high impedance and connected to ground. The other three resistors are programmed to low impedance and connected to VDD. For these examples, assume that low impedance is about 1K ohms and high impedance is about 100K ohms. For the configuration of FIG. 14A, the resistor network creates an output voltage of about (300K/303K)*VDD, which is about VDD. For the configuration of FIG. 14B, the resistor network creates an output voltage of about (201K/303K)*VDD, which is about ⅔ VDD. For the configuration of FIG. 14C, the resistor network creates an output voltage of about (102K/303K)*VDD, which is about ⅓ VDD. Finally, for the configuration of FIG. 14D, the resistor network creates an output voltage of about (3K/303K)*VDD, which is about equal to ground.

As a result, to convert the voltage divider back to a digital signal, a buffer should detect a voltage near ground as a low, and anything at about ⅓ VDD or above as a high. For CMOS logic, this may be accomplished with a simple n-channel transistor.

Figure 15:
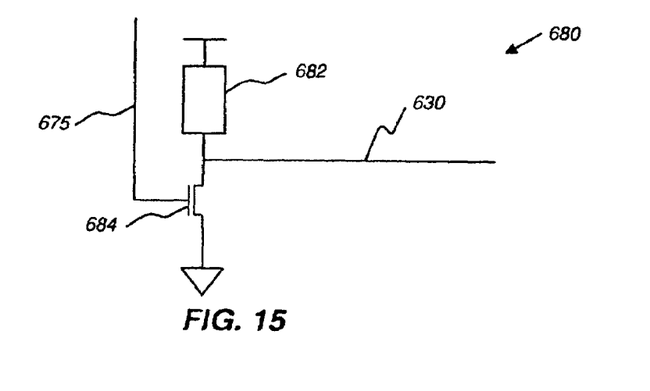
FIG. 15 is an embodiment of a buffer module which may be used to generate product terms from the address decoder.

FIG. 15 illustrates a simple buffer that may be used to buffer and distinguish the voltages described. The simple buffer includes any suitable pull-up element 682 coupled to an n-channel device 684 with the intermediate product term 675 connected to the gate of the n-channel device 684. A low (i.e., about VSS) on the intermediate product term 675 causes the n-channel device 684 to be substantially non-conducting and the product term 630 will be pulled high by the pull-up element 682. Any voltage above the threshold voltage of the n-channel device 684 will cause the n-channel device 684 to conduct and pull the product term 630 low. Threshold voltages for conventional CMOS devices may vary by process parameters but may be in the range of about 0.4 to 0.6 volts. Thus, with a VDD of about 1.8 volts, the ⅓ VDD, ⅔ VDD, and VDD results from the voltage divider network will be recognized as a high, while the 0 volt result will be recognized as a low.

Of course, those of ordinary skill in the art will recognize that the decoding may be expanded to more address bits. By way of example and not limitation, if four address bits are used, the possible voltage levels will be about 0, ¼ VDD, ½ VDD, ¾ VDD, and VDD. The voltage detection for voltage dividers may be used as long as a buffer can resolve the output voltage at about 0 volts as a low, and ¼ VDD or higher as a high. Those of ordinary skill in the art will also recognize that more complex buffers can be used to determine the proper threshold between an asserted and a negated state. By way of example and not limitation, a sense amplifier tuned to specific bias voltage may be used.

Figure 16:
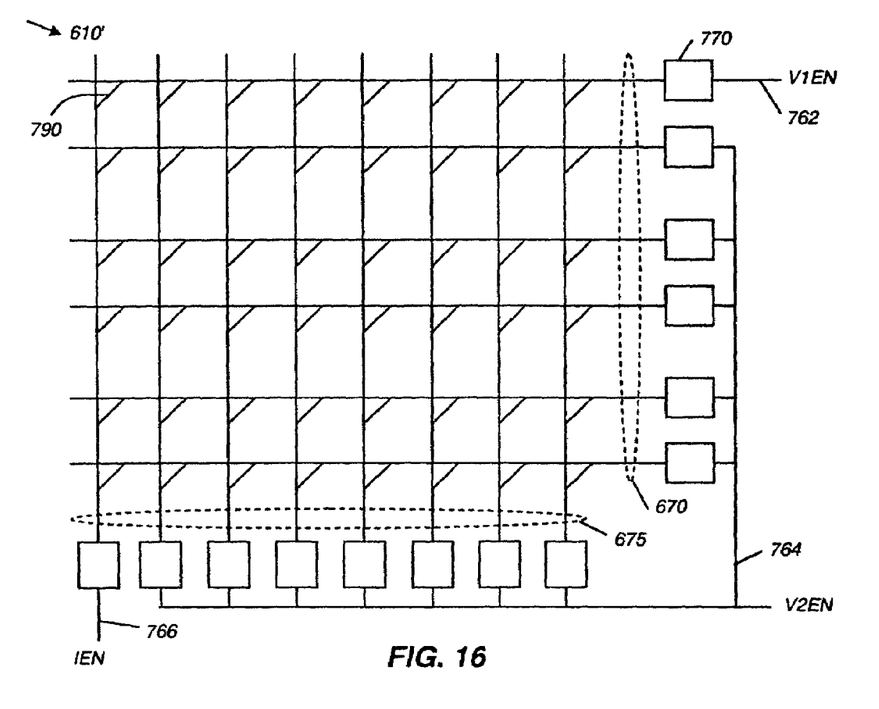
FIG. 16 illustrates structures for programming the address decoder of FIG. 13.
Figure 17:
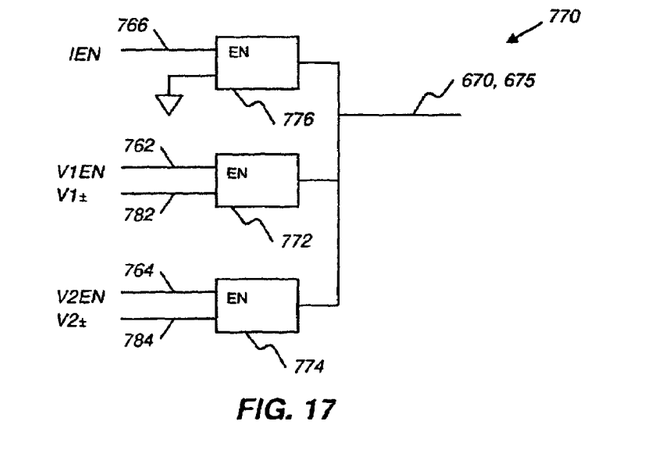
FIG. 17 is an embodiment of an address decoder programming module, which may be used for programming the programmable impedance devices in the address decoder of FIG. 16.

FIG. 16 illustrates a programming model for the address decoder 610'. In FIG. 16, each address term 670 and each intermediate product term 675 is coupled to an address program module 770. Details of one example of an address program module 770 are illustrated in FIG. 17. In the FIG. 17 embodiment, a program signal may be driven from three different voltage sources. Each voltage source is coupled to a different voltage enable signal and voltage signal. V1EN 762 (voltage one enable) is an input to a programming voltage controller 772 to control a programming voltage 782. V2EN 764 (voltage two enable) is an input to a an intermediate voltage controller 774 to control an intermediate voltage 784. Finally, IEN 766 (current enable) controls a current sink 776. The address program modules 770 may also contain an enable signal (not shown) to disable programming during normal operation.

Each programmable impedance device may be programmed by the programming voltage 782, intermediate voltage 784 and the control signals V1EN 762, V2EN 763, and IEN 766. FIG. 16 illustrates the example of a device under programming 790 in the upper left corner. The address program module 770 coupled to the top address term has V1EN 762 asserted, while V2EN 764 and IEN 766 (not shown) are negated. The address program module 770 coupled to the left intermediate sum term has IEN 766 asserted while V1EN 762 and V2EN 764 (now shown) are negated. All other address terms and intermediate sum terms have V2EN 764 asserted while V1EN and IEN (not shown) are negated.

This configuration allows one terminal of the device under programming 790 to be coupled through the current sink 776 to ground, and the other terminal to be coupled to the programming voltage 782. The device under programming 790 may then be programmed using a positive voltage pulse or negative voltage pulse as described above. While the device under programming 790 is being programmed, all other programmable impedance devices which may have a terminal coupled to the programming voltage 782 have the other terminal coupled to the intermediate programming voltage 782. The intermediate programming voltage 782 may be set to a midrange voltage relative to the programming pulse to prevent any programming of those device coupled to the intermediate programming voltage 782. For example, to decrease the impedance of the device under programming 790, the programming voltage 782 pulse may be set to about 1.5 volts and the intermediate voltage 784 may be set to about 1.0 volts. Thus, during the programming pulse, the device under programming 790 receives the full 1.5 volt pulse, while all the other devices receive only the 0.5 volt difference between the programming voltage 782 and the intermediate voltage 784. This smaller 0.5 volt difference is not enough to change the programming of the other programmable impedance devices.

The same process would apply for using a negative voltage pulse 717 and negative intermediate voltage 784 for increasing the impedance of the device under programming 790.

In addition, each programmable impedance device may be selected for programming by enabling V1EN 762 on the address term 670 and IEN 766 on the intermediate product term 675 for that particular programmable impedance device 110. Those of ordinary skill in the art will recognize that V1EN 762 may be used on an intermediate product term 675, and IEN 766 may be used on an address term 670 to accomplish the programming of a device under programming 790.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is
1. A reconfigurable logic device, comprising: a look-up table (LUT), comprising:
a plurality of LUT input signals;
an address decoder operably coupled to the plurality of LUT input signals, the address decoder configured to generate a plurality of product terms;
an array of programmable impedance devices operably coupled to the plurality of product terms, each programmable impedance device comprising:
a first electrode operably coupled to one of the plurality of product terms;
a second electrode disposed to form a junction wherein the second electrode at least partially overlaps the first electrode; and
a programmable material disposed between the first electrode and the second electrode at least at the junction, the programmable material operably coupling the first electrode and the second electrode such that each programmable impedance device exhibits a non-volatile programmable impedance;
at least one LUT output signal operably coupled to at least one of the array of programmable impedance devices; and
at least one storage element configured for sampling the at least one LUT output signal.

2. The device of claim 1, wherein the non-volatile programmable impedance may be reconfigurably decreased by the application of voltage, current, or voltage and current with sufficient magnitude and direction, between the first electrode and the second electrode.

3. The device of claim 1, wherein the non-volatile programmable impedance may be reconfigurably increased by the application of voltage, current, or voltage and current with sufficient magnitude and sign, between the first electrode and the second electrode.

4. The device of claim 1, wherein the programmable material comprises a monolayer.

5. The device of claim 1, wherein the programmable material comprises a plurality of monolayers.

6. The device of claim 1, wherein the LUT further comprises at least one additional programmable impedance device configured as a redundant device and further configured to replace at least one programmable impedance device of the array of programmable impedance devices.

7. The device of claim 1, wherein the device is disposed on a substrate, the substrate including at least one conventional device selected from the group consisting of electronic devices, optical devices, mechanical devices, and combinations thereof.

* * * * *